United States Patent [19]

Armour et al.

[11] Patent Number: 5,457,324

[45] Date of Patent: * Oct. 10, 1995

[54] SPECTRUM ANALYZER IN AN ION IMPLANTER

[75] Inventors: David G. Armour, Salford; Johnathan G. England, Horsham; Neil Bryan, Hedon; Jakob A. Van den Berg, Didsbury, all of United Kingdom

[73] Assignee: Applied Materials, Inc., Santa Clara, Calif.

[*] Notice: The portion of the term of this patent subsequent to Jan. 24, 2012 has been disclaimed.

[21] Appl. No.: 298,003

[22] Filed: Aug. 30, 1994

Related U.S. Application Data

[63] Continuation of Ser. No. 123,504, Sep. 17, 1993, Pat. No. 5,384,465.

[51] Int. Cl.[6] .................................................. H01J 37/317
[52] U.S. Cl. ................... 250/492.21; 250/398; 250/391; 250/305
[58] Field of Search ........................... 250/492.21, 492.2, 250/398, 397, 305

[56]  References Cited

U.S. PATENT DOCUMENTS

| | | | |
|---|---|---|---|
| 3,857,090 | 12/1974 | Chick | 250/492.21 |
| 5,113,074 | 5/1992 | Sferlazzo | 250/492.2 |
| 5,198,676 | 3/1993 | Benveniste et al. | 250/492.21 |
| 5,384,465 | 1/1995 | Armour et al. | 250/492.21 |

*Primary Examiner*—Jack I. Berman
*Attorney, Agent, or Firm*—A. Oliver Stone; Rupert E. Cross; Charles S. Guenzer

[57]  ABSTRACT

An ion implanter for implanting ions into a semiconductor wafer comprises means for generating an ion beam, means for receiving charged particles ejected from the ion beam, first means for rejecting those of the received charged particles below a first predetermined energy, second means for rejecting those of the received charged particles above a second predetermined energy, the first predetermined energy being lower than the second predetermined energy. The ion implanter further comprises means to count the number of received charged particles between the first and second predetermined energies, and scanning means for scanning the first and second predetermined energies to determine the energy at which the number of received charged particles between the first and second predetermined energies is a maximum.

21 Claims, 10 Drawing Sheets

SPECTRUM ANALYZER IN AN ION IMPLANTER

This is a continuation of application Ser. No. 08/123,504 filed on Sep. 17, 1993, now U.S. Pat. No. 5,384,465.

FIELD OF THE INVENTION

This invention relates to ion implanters for implanting ions from an ion beam into semiconductor wafers, and in particular to ion implanters which include arrangements for monitoring and controlling the potential in the ion beam.

DESCRIPTION OF PRIOR ART

As devices fabricated on semi-conductor wafers become smaller and smaller and more complex, and the oxide layer on the wafer surface becomes necessarily thinner, the potential at the oxide surface induced by an ion implanter becomes more and more critical. If the surface potential is too great, the field across the oxide layer, which may typically have a thickness of the order of 100 to 200 angstroms, may be sufficient to cause electrical breakdown of the oxide layer. Damage to the oxide layer as a result of too great a surface potential may lead to either complete destruction of the device, leading to loss of yield or to a reduction in device lifetime.

The induced surface potential of the wafer is closely related to the potential of the ion beam. It is therefore important to be able to monitor and control the potential of the ion beam to keep it to a minimum. A method of measuring the potential of an ion beam is described in U.S. Pat. No. 5,113,074, to Sterlazzo. The method involves measuring the energy of slow ions ejected radially from the ion beam. Slow ions are formed at rest inside the beam plasma. The main mechanism for slow ion production is charge exchange, which involves a quantum mechanical jump of an electron from a slow neutral gas atom or molecule to a beam ion with negligible energy being transferred to the slow ion in the process. The kinetic energy of the slow ions measured outside the beam therefore reflects the potentials inside the beam, assuming no further interactions with the slow ions take place. The slow ion sensor consists of four concentric circular electrodes each in the form of a grid and positioned coaxially with the beam axis. The innermost electrode adjacent the beam serves to screen the beam from the other electrodes. The second nearest electrode to the ion beam is biased to repel low-energy electrons created during ion collision with gas particles. The third electrode is biased to repel low-energy ions back to the ion beam and the fourth, outermost electrode acts as an electroscope. When the biasing or electric potential maintained on the ion repelling electrode is increased sufficiently to repel all (or most) low-energy ions, the ion current sensed by the electroscope falls off rapidly in a step-like fashion. When this occurs, the control potential on the electrode is taken to be equal to the beam potential.

One problem with this known sensor is that ions impinging on the surfaces of the grid electrodes cause emission of electrons, which are accelerated by the ion repelling electrode to the outer electrode, thereby tending to decrease the slow ion current as measured on the electroscope.

A further drawback is that the sensor measures the current contributed by all slow ions ejected from the beam above a predetermined energy, depending on the voltage applied to the ion repelling electrode. The energy of the beam is taken to be that at which the measured slow ion current falls to a minimum. However, the majority of slow ions are created near the centre of the ion beam where the ion concentration is a maximum and therefore, a more accurate measure of the potential of the ion beam would be the energy of the majority of slow ions. The prior art sensor is incapable of providing such information.

As constraints on surface potential become more and more stringent owing to continual reduction in device size, increased complexity and process demands, e.g. higher beam currents, energies and a greater number of implants steps, it is increasingly important to be able to measure the beam potential with a high degree of accuracy. There is therefore a need to provide a means of measuring the ion beam potential more sensitively, and it is also desirable to provide an instrument capable of yielding more information regarding the distribution of potential over the ion beam cross-section and to provide sensing apparatus capable of providing more information regarding the processes occurring within the ion beam.

SUMMARY OF THE INVENTION

According to one aspect of the present invention there is provided an ion implanter for implanting ions into a semiconductor wafer, comprising means for generating an ion beam, means for receiving charged particles ejected from said ion beam, first means for rejecting those of the received charged particles below a first predetermined energy, second means for rejecting those of said received charged particles above a second predetermined energy, said first predetermined energy being lower than said second predetermined energy, means to count the number of received charged particles between said first and second predetermined energies, and scanning means for scanning the first and second predetermined energies to determine the energy at which said number is a maximum.

Thus, the invention enables the intensity of slow ions between two predetermined energies to be measured so that the energy of the majority of slow ions can be determined to enable a more precise measurement of the ion beam potential to be made.

Furthermore, since the present invention measures the total number of ions within a preset energy band, as opposed to the total number of slow ions above a predetermined energy, there is no need for an ion repelling grid electrode through which all the analyte ions must pass before being measured, as required by the prior art apparatus. Thus the present invention enables a potential cause for the production of secondary electrons to be eliminated.

In one embodiment, the means to receive the charged particles comprises a chamber having opposed front and back ends, the front end defining a first aperture to allow charged particles from the ion beam to enter the chamber, and the back end defining a second aperture to allow charged particles to exit the chamber, and deflection means to deflect charged particles along a curved path, whereby charged particles between the first and second predetermined energies pass through the second aperture. In this embodiment, the energy band is selected by deflecting slow ions within the energy band along a curved path which passes through the second aperture.

In a preferred embodiment, the chamber has a longitudinal axis between the ends, and the ion implanter further includes means to accept for transmission through the chamber only those of the received charged particles having a non-zero angle of entry into said chamber relative to the axis, and wherein the deflection means is arranged to deflect charged particles transmitted into the deflection region in a direction toward the axis. The axis may be offset to one side of the chamber or maybe a central axis. By selecting only those ions or charged particles having a non-zero angle of incidence relative to the longitudinal chamber axis for transmission into the deflection region, and then arranging the deflection means to deflect the charged particles in a direction toward the axis, the curvature of the path taken by the transmitted particles can be maximised in the minimum space, allowing the chamber to be made as compact as possible, while at the same time requiring the deflection means to apply a greater force on ions of a particular energy to enable those ions to be transmitted through the second aperture. Thus, this embodiment also provides greater sensitivity.

In another embodiment, the means for rejecting the upper and lower energy particles comprises first and second electrodes formed to define a curved passage therebetween, and means to apply an electric field between the electrodes sufficient to allow charged particles between the first and second predetermined energies to be transmitted through the curved passage. A preferred embodiment further comprises energy changing means to change the energies of the received charged particles by a predetermined energy before the particles enter the curved passage, to enable charged particles of different energies to be transmitted through the passage for a fixed electric field. In this embodiment, the pass energy of the curved passage can be fixed to optimise the energy resolution, and ions from the ion beam can be selected for measurement by changing their energy to the pass energy.

According to another aspect of the present invention, there is provided an ion implanter for implanting ions into a semi-conductor wafer, comprising ion beam generating means, means for measuring the energy of charged particles ejected from said ion beam, means to form a control signal related to the energy of the said control signal to control a parameter in said ion beam generator means.

It has been found by the inventors that the ion beam potential depends on parameters controlling the production of the ion beam. The beam generator typically comprises an ion source in which a plasma of ions is generated by a filament, and a plurality of electrodes external of the ion source to form the ion beam. The ion beam generator is normally tuned for maximum current by a adjusting the gap between the electrodes and the ion source and varying the potentials on the electrodes. The ion beam potential has been found to depend on the tuning conditions, and the invention enables the ion beam potential to be monitored and controlled by a adjusting the tuning parameters.

BRIEF DESCRIPTION OF THE DRAWINGS

Examples of embodiments of the present invention will now be described with reference to the drawings in which.

DESCRIPTION OF PREFERRED EMBODIMENTS

Figure 1:
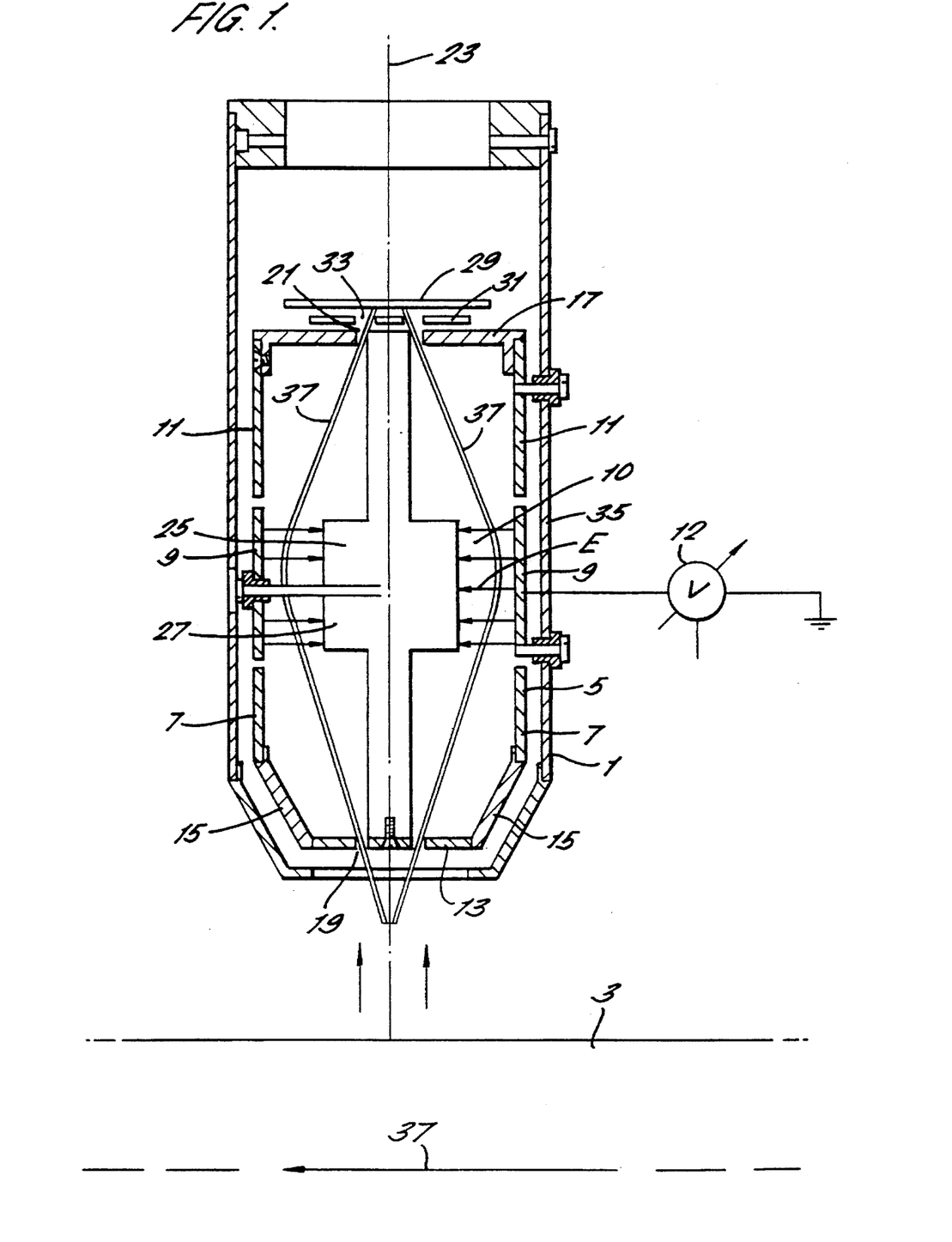
FIG. 1 shows a cross-sectional view of a first embodiment of a sensor implemented in an ion beam implanter for measuring the number of slow ions within an energy band ejected from the ion beam.

Referring to FIG. 1, a sensor 1 for measuring the number of slow ions within a particular energy band ejected from an ion beam 3 comprises a cylindrical chamber 5, formed by a serial array of cylindrical and coaxially aligned electrodes 7, 9 and 11. The chamber 5 has a front end 13 in the form of a disc having a smaller diameter than the diameter of the electrodes 7, 9 and 11 and is connected to the front cylindrical electrode 7 by frusto-conical section 15. The chamber 5 also has a back end 17 in the form of a flat circular disc, connected to the back cylindrical electrode 11. An annular aperture 19, 21 is formed in each of the front and back ends 13 and 17 adjacent to and coaxial with the cylindrical axis 23 of the chamber 5 for allowing charged particles to pass into and out of the chamber. A central cylindrical electrode 25 is mounted within and coaxially with the chamber 5. The central electrode 25 extends the length of the chamber 5 and the diameter of the ends of the electrode 25 are equal to the diameter of the respective annular slit 19, 21. The central electrode 25 has a middle portion 27 of larger diameter than its end portions disposed opposite the middle electrode 9. Thus, there is no direct line of sight between the annular slits 19, 21. The middle cylindrical electrode 9 is connected to a variable DC voltage generator 12 to controllably voltage bias the middle cylindrical electrode 9, to form an electric field E between the middle section 27 of the central electrode 25 and the middle cylindrical electrode 9, and so to form a deflection region 10. The middle portion 27 of the central electrode 25 and the middle cylindrical electrode 9 define an annular aperture into the deflection region 10, between the electrodes 9 and 27, which allows only those charged particles having an angle of entry into the chamber relative to the chamber axis 23 above a predetermined value to pass into the deflection region 10.

An electrode 29 is mounted behind the back end 17 of the chamber 5 for collecting charged particles passed through the rear aperture 21 of the chamber 5. The charge collecting electrode 29 may be connected to voltage biasing means (not shown) for voltage biasing the electrode 29 and is connected to a suitable means (not shown) for counting the number of charged particles collected on the electrode 29, which may comprise an ammeter. A further electrode 31 is mounted between the back end 17 of the chamber and the collector electrode 29 for preventing oppositely charged particles to those which are to be measured by the collector electrode 29 from passing to the collector electrode 29. An annular slit 33 is formed in the electrode 31 to allow charged particles of the selected polarity to pass to the collector electrode 29. An advantage of this arrangement over the prior art is that only those ions within a selected, relatively narrow, energy band pass through an electrode for suppressing electrons. In the prior art arrangement, all the received ions must pass through an electron repelling electrode, which increases the probability of secondary emission from the grid because of the large ion cross-section. Furthermore, because the ions selected for measurement are all confined within an extremely narrow path, the electron repelling electrode need be formed with only a single aperture of sufficient diameter to allow the selected ions to pass through to the collector electrode 29, so that a grid-type electrode for subjecting a stream of charged particles spread over a relatively large area to the same potential, is not required. Thus, the present arrangement is very effective in filtering out unwanted charged particles and reducing the probability of secondary emission, and therefore has increased accuracy and sensitivity.

The chamber 5, and electrodes 29 and 31 are all mounted within a second outer chamber 35 which serves to screen the inner chamber 5 and electrodes from charged particles ejected from the ion beam 3. The chamber 5 is mounted such that its central axis 23 is perpendicular to the ion beam axis 37. However this need not necessarily be the case, and the chamber may be mounted so that the angle between the chamber axis and the ion beams axis can be varied. This would allow the sensor to scan charged particles ejected over a wide range of angles from the ion beam.

The operation of the sensor 1 will now be described assuming that the charged particles to be measured are slow ions. The front and back end plates 13 and 17, section 15, electrodes 7, 11 and 25 are all placed at ground potential. A positive potential relative to ground is applied to the middle electrode 9 of the chamber 5 by the voltage source 12, which forms an electric field E between the middle electrode 9 and the central electrode 25. Slow ions from the ion beam 3 enter the chamber 5 through the front aperture 19 with a range of angles relative to the central axis 23. A proportion of those ions which enter the chamber at a sufficient angle will pass into the deflection region 10 defined by the annular space between the middle electrode 9 and the middle portion 27 of the central electrode 25. The ions which pass into this region will be deflected by the electric field E back towards the central axis 23 and will be deflected through different angles depending on their kinetic energy. Ions within a predetermined energy band, whose centre energy is defined by the electric field F applied between the electrodes 9 and 25, and whose band width is defined by the geometry of the sensor, will travel along the curved path 37 and pass through the rear aperture 21 to be measured by the collector electrode 29. Ions having energies below and above the energy band will be deflected away from the curved path 37 and so will not pass through the rear aperture 21 but will be absorbed by the grounded electrodes.

To measure the energy spectrum of slow ions ejected from the ion beam, the center energy of the energy band can be systematically swept by increasing or decreasing the voltage applied to the middle electrode 9.

One advantage of the sensor shown in FIG. 1 is that it may be made as compact as necessary for mounting in almost all types of existing ion implanters. Secondly, because ions within the desired pass band are selected by simply applying a force transverse to their initial direction of motion, the measured ions do not pass through a series of grid electrodes placed perpendicular to their direction of motion, which advantageously reduces the possibility of secondary electron emission, as mentioned above. Thirdly, because the sensor in FIG. 1 requires a minimum of only one electrode to control the ion pass energy, the sensor is simple to control and requires only one voltage source or generator.

In an alternative embodiment, the collector electrode 29 may be replaced by a channeltron to enable a more sensitive measurement of slow ion current to be made and advantageously, a mass spectrometer may be interposed between the channeltron and the rear exit slit 21 to analyse the energy spectrum of ions of different masses. Preferably, the spectrometer would be a quadrupole mass spectrometer. Although the operation of the sensor shown in FIG. 1 has been described in relation to measuring slow ions, the sensor may be adapted to measure electrons, by applying a negative potential to the middle electrode 9.

The dispersion of the sensor shown in FIG. 1 is defined as the difference in voltages $\Delta V$, applied to the control electrode 9 in order to separate two peaks of different energies, $\Delta E$. The dispersion is a function of angular deviation through which an ion has to be deflected in order to be transmitted through the sensor, and may be increased by increasing the angular deviation. Conveniently, the dispersion can be varied by varying the diameter of at least one of the front and rear annular slits.

The energy resolution of the sensor is defined as $\Delta E/E$ where E is the energy and $\Delta E$ is the full width half maximum (FWHM) of the peak. The peak width is proportional to the (input angular spread of received ions)$^3$. Conveniently, the energy resolution of the sensor may be improved by decreasing the input slit width.

It has been found in practice that the majority of slow ions ejected from the ion beam are ejected at 90° to the beam axis. Therefore, to increase the number of ions transmitted through the sensor shown in FIG. 1, an input lens could be fitted to the front end of the sensor to deflect the ions ejected at 90° to the correct angle for transmission through the sensor. Alternatively, the sensor may simply be mounted at a suitable angle to the beam axis to allow ions ejected perpendicularly from the beam to be measured.

Figure 4:
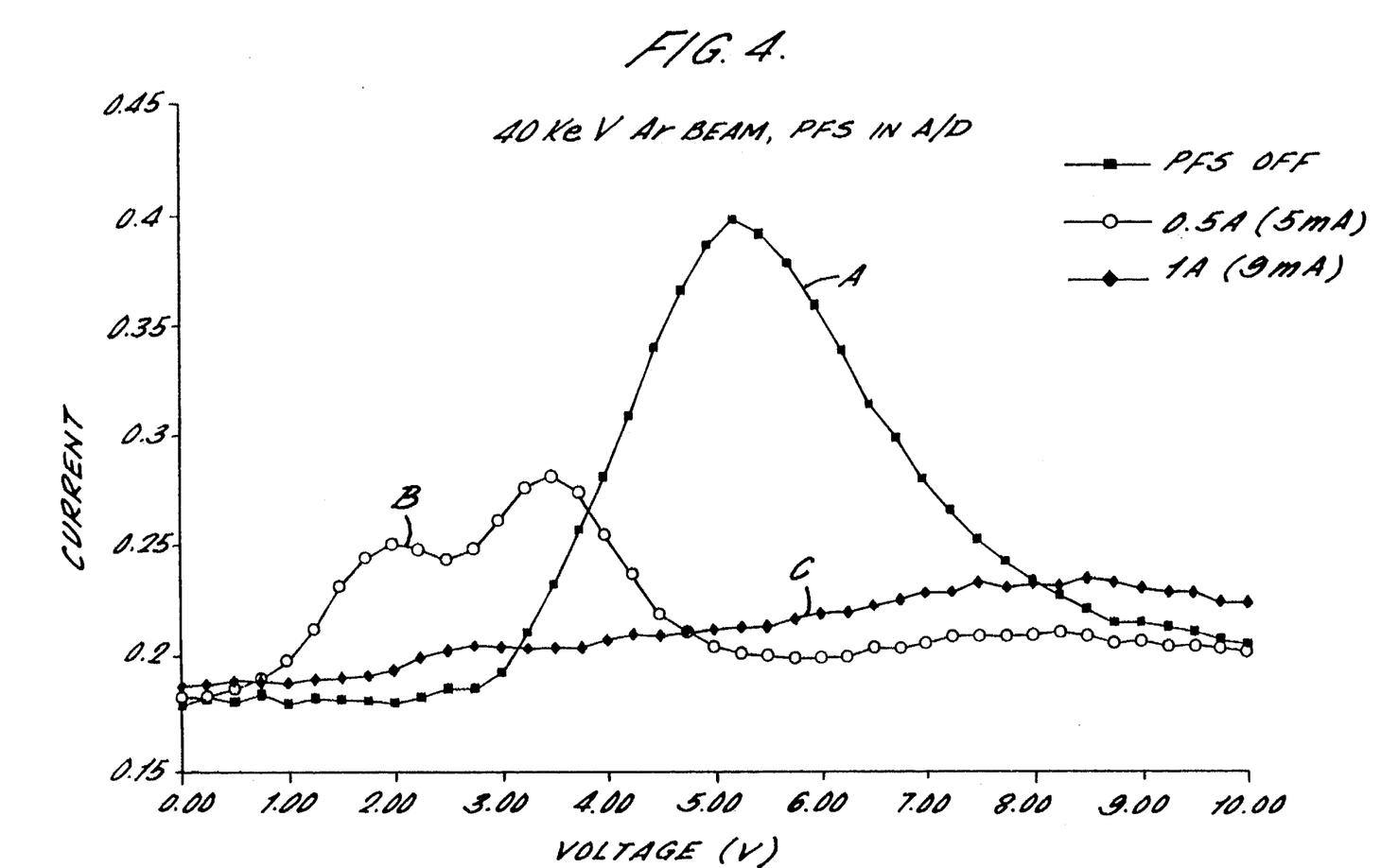
FIG. 4 shows a graph of slow ion current versus control electrode voltage measured by the sensor shown in FIG. 1 for various ion beam neutralising conditions.

FIG. 4 shows the variation of collected slow ion current with control electrode voltage under various charge neutralising conditions using a plasma flood system for neutralising the ion beam with low energy electrons. The voltage applied to the control electrode is proportional to the center energy of the ion energy pass band. The plasma flood system (PFS) is shown schematically in FIG. 9. The three curves shown in FIG. 4 demonstrate that the ion beam potential decreases with increasing charge neutralisation provided by electrons from the PFS. Curve A shows a peak intensity at a relatively high slow ion energy with no charge neutralisation provided by the PFS. Curve B shows a shift in the energy of peak intensity to a lower value below the energy of peak intensity of curve A, with the PFS turned on, indicating a reduction in the beam potential. The two peaks in curve B may indicate regions of different potential within the ion beam. Finally, curve C is relatively flat with no peaks, indicating reasonable charge neutralisation at the centre of the ion beam with increased electron flux from the PFS.

Figure 2:
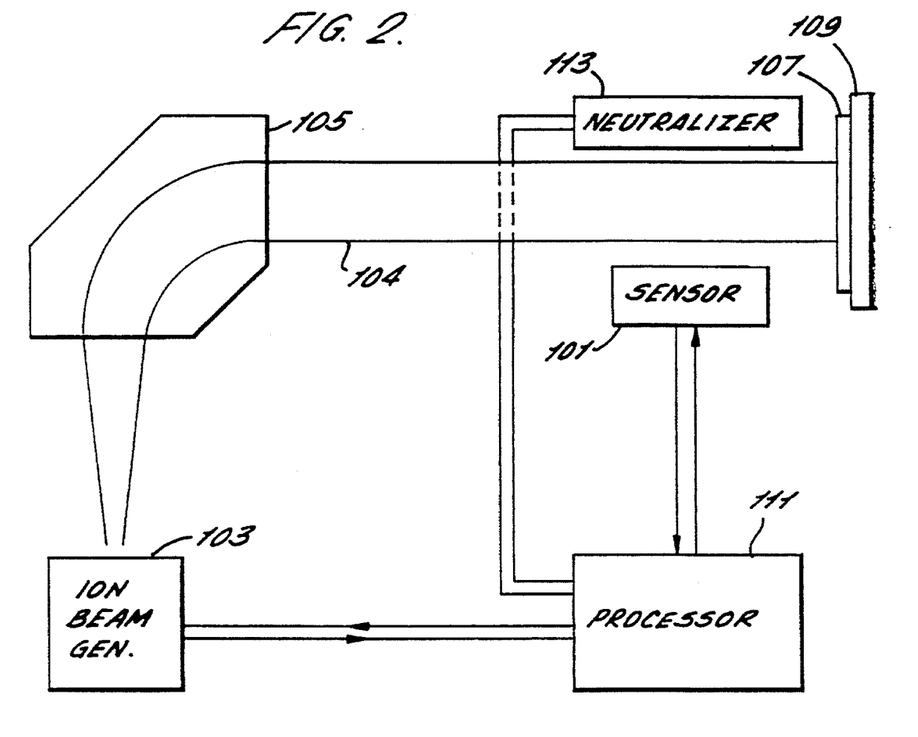
FIG. 2 shows a schematic diagram of an ion implanter including a feedback control from a slow ion energy sensor to an ion beam generator, in accordance with an embodiment of the present invention.

FIG. 2 shows a schematic diagram of an ion implanter including an ion beam generator 203 for generating and forming an ion beam 104, an ion mass selector 105 including a magnet for selecting ions of the desired mass for implantation and a wafer 107 or other substrate mounted on a suitable substrate 109. A sensor 101, preferably of the invention, for measuring the energy of slow ions ejected from the ion beam and therefore the ion beam potential is mounted adjacent the ion beam 104. An ion beam neutralizing system 113 comprising a plasma flood gun for injecting low energy electrons into the ion beam is disposed adjacent the beam 104 and connected to a central processor/ controller 111. The central controller/processor 111 is arranged to receive signals indicative of the measured slow ion energy from the sensor 101 and to communicate with and to generate control signals to control the ion beam generator 103 and/or the beam neutralising system 113.

Figure 3:
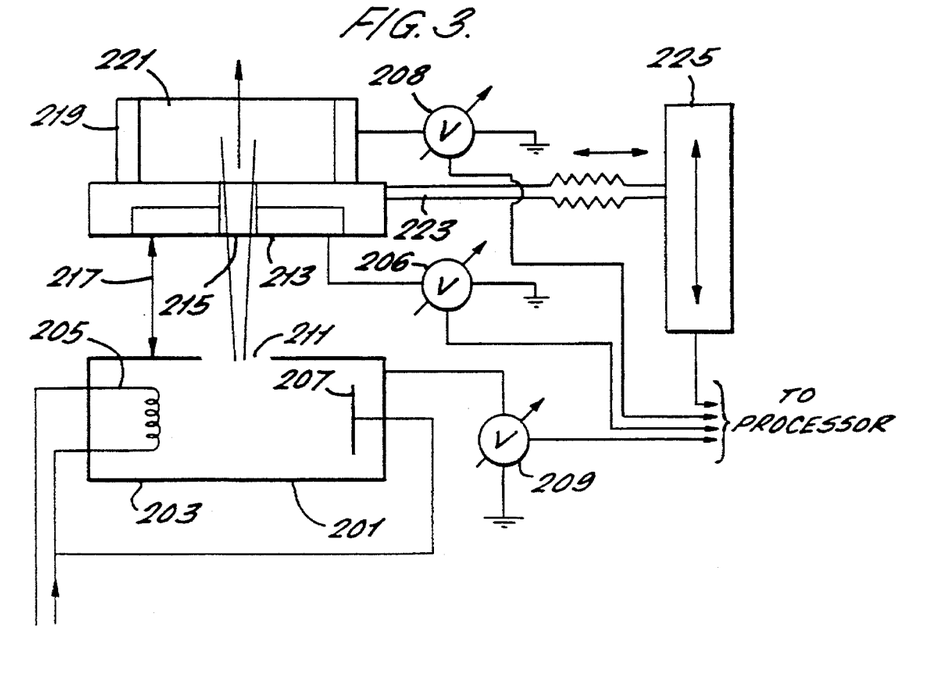
FIG. 3 shows in more detail an embodiment of the ion beam generator shown in FIG. 2.

The components of an ion beam generator are shown schematically in FIG. 3. Further details may be found in U.S. patent application Ser. No. 07/898,854, filed Jun. 15, 1992 by Bright et al. Referring to FIG. 3, the ion beam generator comprises an ion source 201, comprising a chamber 203, a filament 205 and an electrode 207 both mounted within the chamber. The chamber 203 contains gas at a predetermined pressure. The gas is ionised, so forming a plasma by heating the filament 205 by passing a current through it. A voltage source 209 is arranged to apply a suitable voltage to the chamber 203. An exit aperture 211 is formed in the chamber to allow ions to exit the chamber 201. An extraction electrode 213 having an aperture 215 formed therein is disposed opposite the exit aperture 211 and spaced from the chamber 203 by a distance which will be referred to as the extraction gap. 217. A further electrode 219 having an aperture 221 formed therein, is positioned on the other side of the extraction electrode 213 away from the chamber 201 and spaced from the extraction electrode 213. Both the extraction electrode 213 and the further electrode 219 are mounted on a telescopic armature 223 so that the alignment between the aperture 215 in the extraction electrode 213 and the exit aperture 211 in the chamber 201 can be adjusted. The armature 223 is in turn mounted on a conveyor system 225 which enables the extraction gap 217 between the chamber 203 and the extraction electrode 213 also to be varied. The extraction electrode 213 and the further electrode 219 are electrically insulated from each other and each is connected to a separate voltage source 206 and 208. Each of the voltage soruces 206, 208 and 209 and the conveyor system 225 are connected to the central processor 111 which generates control signals for controlling the potential on each of the electrodes 213, 219 and the chamber 203, and the extraction gap 217. Thus, the measured slow ion energy can be used in a feedback loop to control parameters in the ion beam generator 103, such as the extraction gap 217 and the potential on the electrodes or to control parameters in the beam neutralizing system 113 in order to maintain the ion beam potential at a minimum. For example, the central processor may control the sensor to lock onto the slow ion peak intensity. The processor may then generate a control signal for controlling the ion beam generator and/or neutralizer depending on the measured energy at peak intensity.

The magnetic optics for this type of machine are described by Aitkin et al. in U.S. Pat. No. 4,578,589. The beam 104 travels between the analyzing magnet 105 and the substrate 107 along a linear path partially within a drift tube, such as disclosed by Bright et al. in U.S. patent application Ser. No. 07/850,016, filed Mar. 3, 1992 and also published as European patent application EP 0 491 331 A2.

Figure 5:
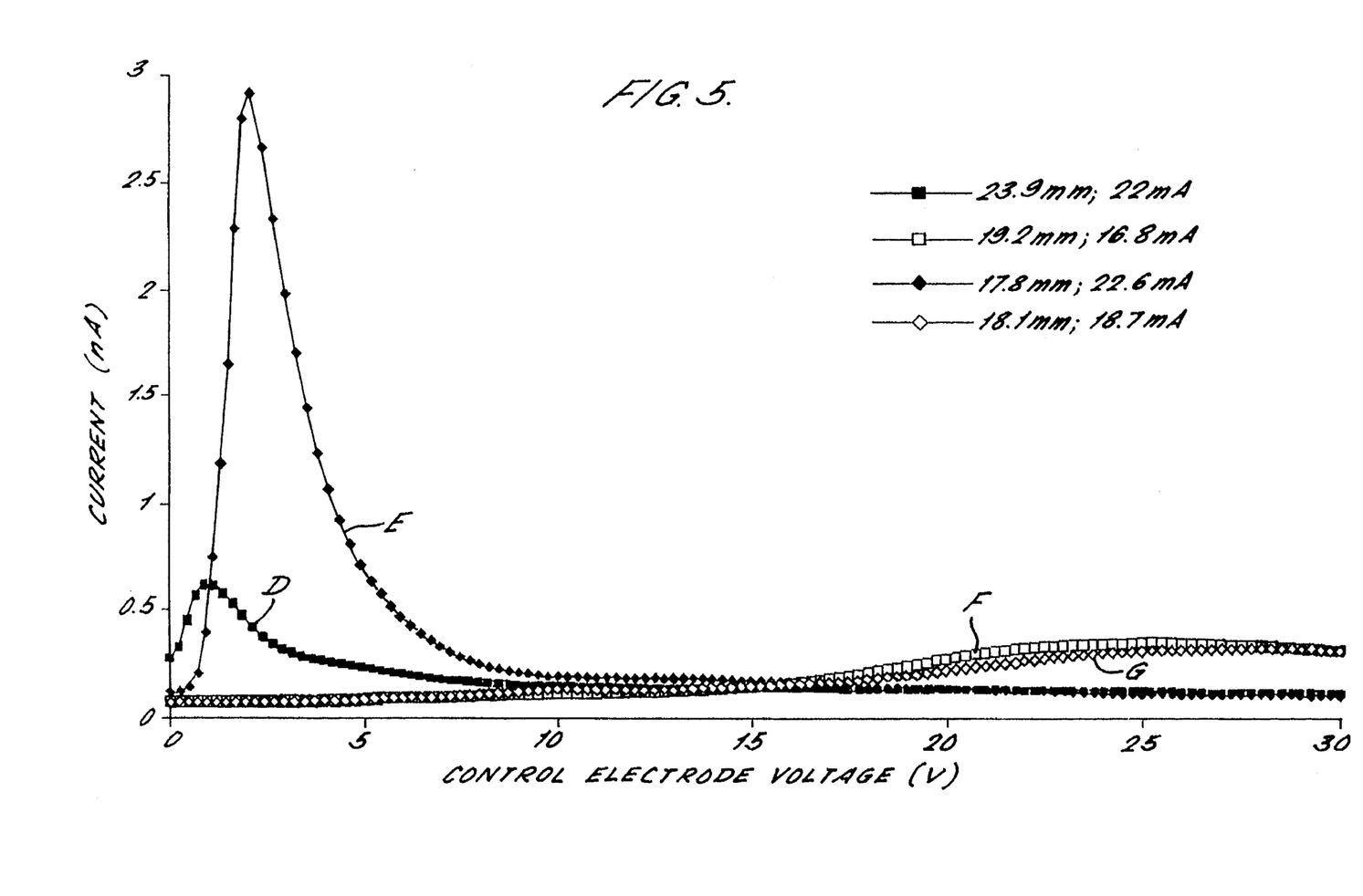
FIG. 5 shows a graph of slow ion current versus control electrode voltage, as measured by the sensor shown in FIG. 1, for various spacings between the ion source and the first beam forming electrode, shown in FIG. 3.

FIG. 5 shows a graph of the variation of slow ion current with ion energy for different values of extraction gap. With reference to FIG. 5, curve D demonstrates that for one particular implant system, the slow ion current peaks at lowest energy (and therefore the lowest beam potential occurs) at an extraction gap of 23.9 mm. Curve E demonstrates that a peak intensity in the slow ion current occurring at a slightly higher slow ion energy is found at an extraction gap distance of 17.8 mm. However, curves F and G demonstrate that a much higher beam potential occurs at extraction gaps intermediate of these two values. These results were obtained with the sensor shown in FIG. 1, and show that the ion beam potential is extremely sensitive to the extraction gap, there being a difference of only 0.3 mm between curves E and G.

Figure 6:
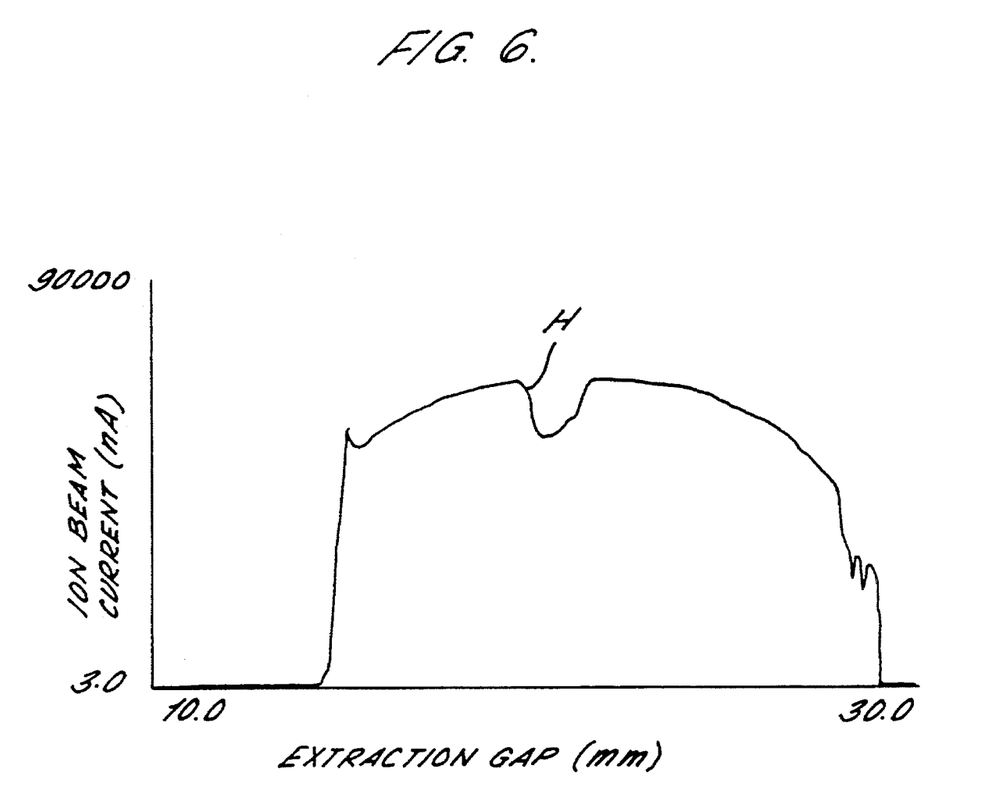
FIG. 6 shows a graph of the variation of ion beam current with spacing between the ion source and the first ion beam forming electrode, shown in FIG. 3.

FIG. 6 shows the variation of ion beam current with extraction gap which was measured simultaneously with the slow ion current as a function of ion energy shown in FIG. 5. The dip H in the ion beam current corresponds to extraction gap distances at which the ion beam potential is relatively high, as demonstrated by curves F and G in FIG. 5. Thus, a measure of ion beam current and in particular the position of the dip h with extraction gap can also be used to monitor the ion beam potential.

Figure 7:
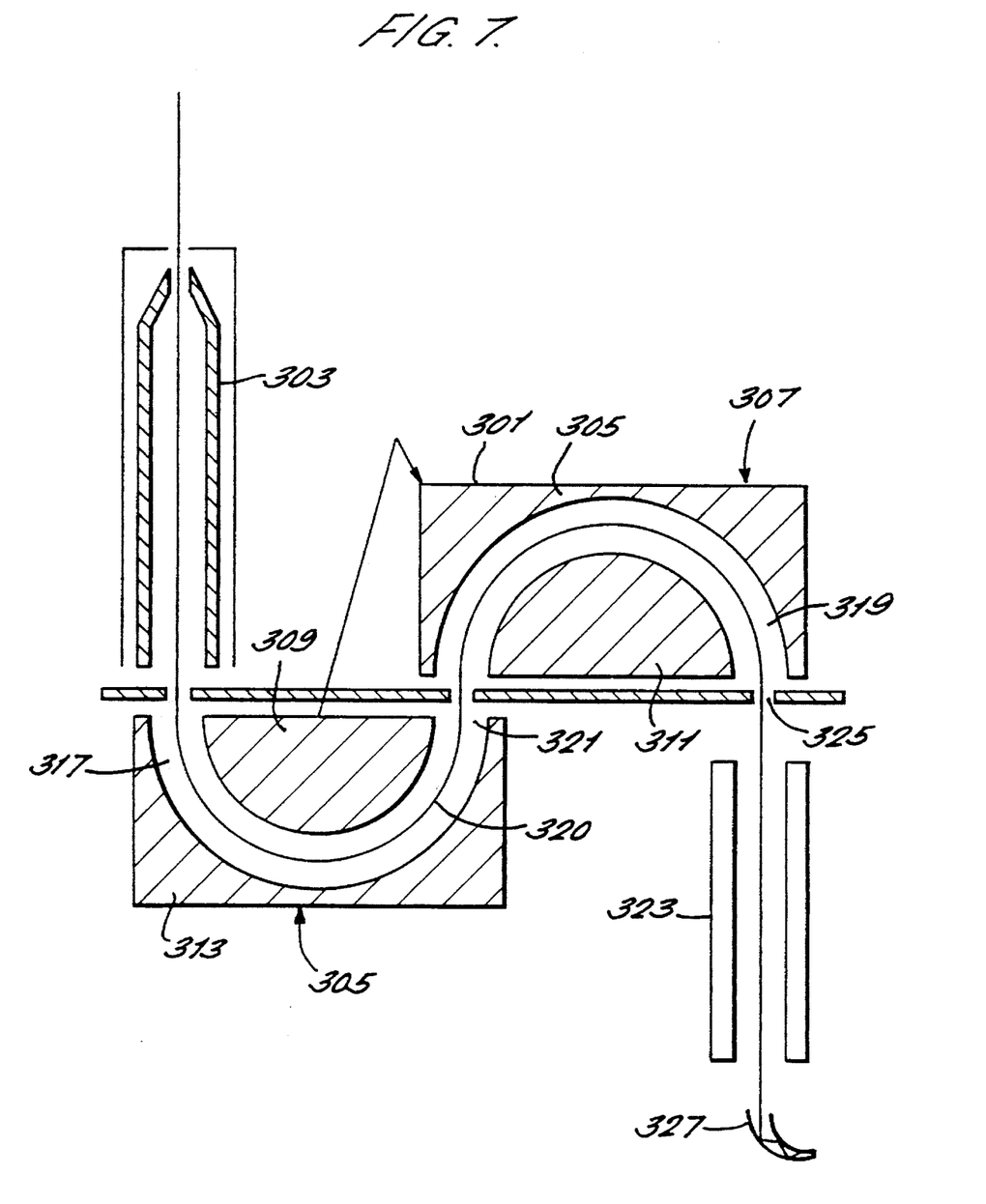
FIG. 7 shows a second embodiment of a sensor implemented in an ion implanter for measuring the number of slow ions within an energy band ejected from the ion beam.

FIG. 7 shows a second embodiment of a sensor for measuring the number of ions within an energy band ejected from an ion beam. This sensor was previously commercially available from VSW Scientific Instruments Limited, U.K. as model IBA 5. Its operation for scanning, as well as that of the cylindrical mirror analyzer of FIG. 1, is described in the text book *Methods of Surface Analysis—Techniques and Applications,* J. M. Walls ed. (Cambridge University Press). The sensor 301 comprises an input lens 303 for receiving and focusing charged particles ejected substantially radially from the ion beam and a pair of ion energy selectors 305 and 307. Each of the energy selectors comprises an inner electrode 309, 311 and an outer electrode 313 and 315 defining a parallel sided passage 317, 319 curved in a semi-circle. The exit 321 of the passage 317 of the first energy selector 305 and the entrance of the passage 319 of the second energy selector 307 are both centrally and tangentially aligned so that the beam path 320 has the form of an "S". A quadrupole mass spectrometer 323 for selecting ions of different mass or charge is disposed adjacent to the exit 325 of the second energy selector 307, and a channeltron 327 for measuring the ion current is disposed on the other side of the mass spectrometer 323.

Figure 8:
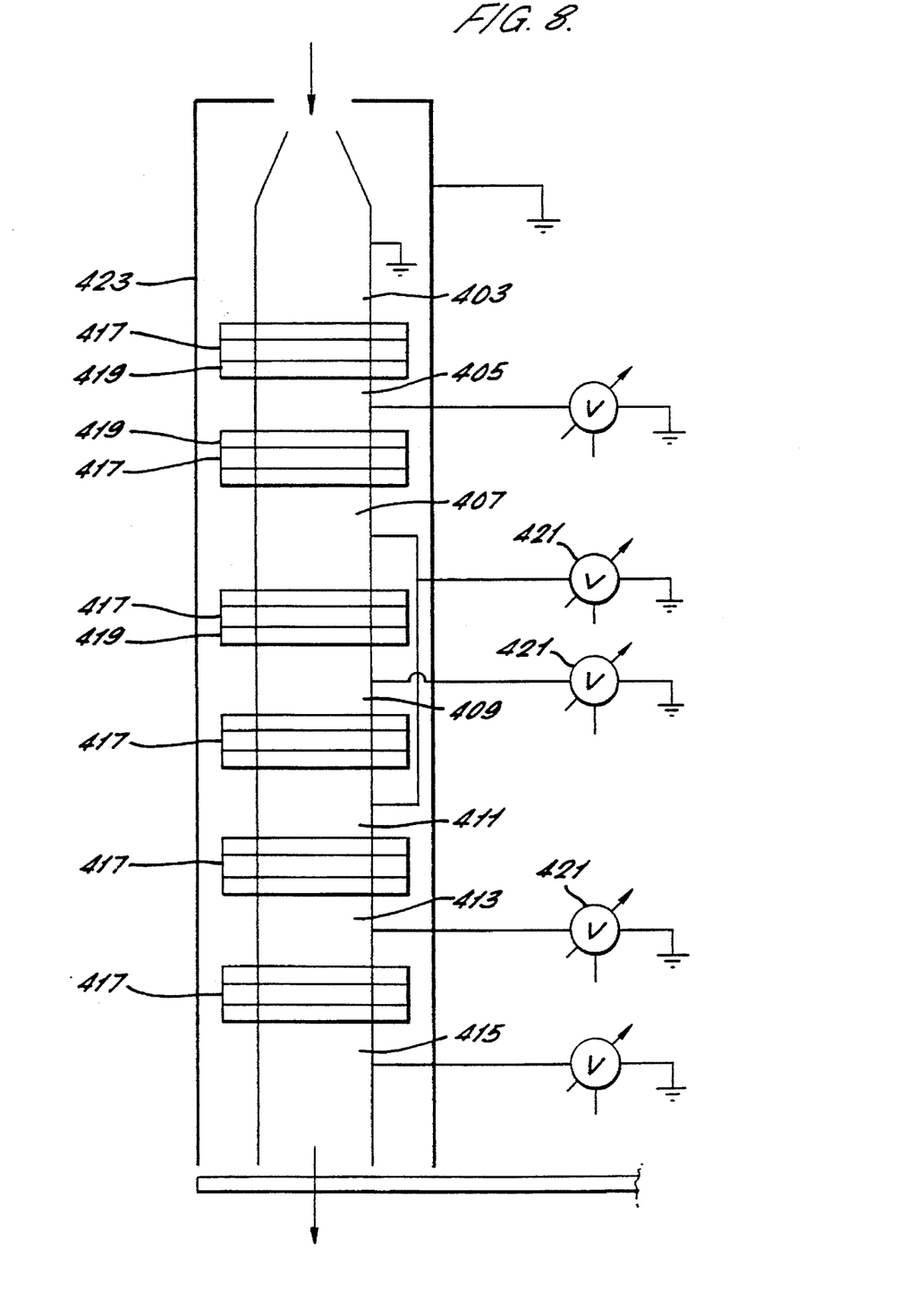
FIG. 8 shows in more detail an example of an input lens for use with the embodiment shown in FIG. 7.

A preferred embodiment of the input lens 303 is shown in FIG. 8, and comprises a cascade of serially arranged cylindrical electrodes 403, 405, 407, 409, 411, 413 and 415. Neighboring electrodes are spaced apart by a dielectric annular ring 417 which is seated between flanges 419 formed at the ends of the cylindrical electrodes. Each cylindrical electrode can be electrically insulated from the others and each may be connected to a voltage source 421 to bias each section individually to the required potential. The input lens includes a screening shield 423 to screen the cylindrical electrode sections 403, 405, 407 etc, from ions ejected from the ion beam which may change the potential o the electrode members. Conversely, the screen 423 screens the ion beam from the electrodes, whose potentials may adversely affect the beam characteristics.

Returning to FIG. 7, the energy selectors 305 and 307 only transmit charged particles within a predetermined energy range, whose center energy depends on the electric field applied between their respective electrodes 305, 309 and 307, 311. The energy resolution $\Delta E/E_p$ of each energy selector is given by $$\Delta E/E_p = (W/2R_0 + a^2)$$

where 'W' is the slit width at the exit of the energy selector, '$R_0$' is the radius of the medial ion path around the energy selector and 'a' is the half angle acceptance of the energy selector.

In one particular embodiment, W=4 mm, $R_0$=50 mm and a=3°–4°, which gives an energy resolution of 4%.

The sensor shown in FIG. 7 can be operated in one of two modes. In one mode the input lens is used simply to focus the charged particles into the first energy selector and the energy pass $E_p$, is scanned by changing the electric field across the electrodes. In the second mode of operation, the energy pass $E_p$ of the energy selectors is maintained constant and the input lens is used to scan the charged particles by increasing or decreasing their kinetic energy by a predetermined amount, by changing the potentials on the electrodes, so that only those which enter the energy selector at the correct pass energy are transmitted. The input lens is preferably arranged, by adjusting the potentials applied to each electrode, such that its transmission properties are independent of the energy of the ions, i.e. the transmission loss is independent of energy. In practice, the latter of the two modes is preferred because the energy resolution is maintained constant for the range of energies measured.

Figure 9:
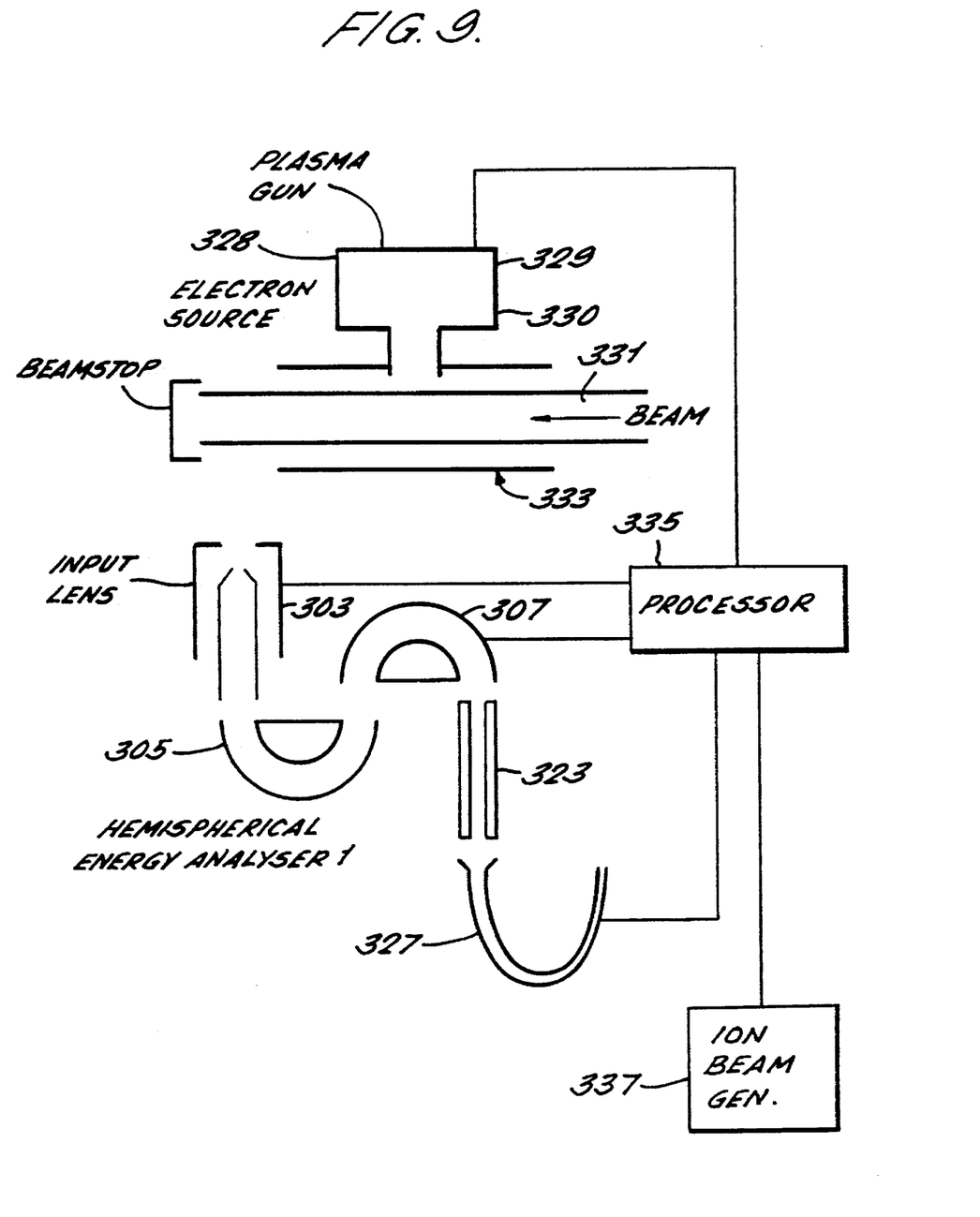
FIG. 9 shows a schematic diagram of the embodiment shown in FIG. 7 in conjunction with a plasma floodgun for neutralising the ion beams.

FIG. 9 shows a schematic diagram of a beam neutralizing system 328 comprising an electron plasma gun 329 for injection of electrons into the ion beam 331 having an electron source 330 for producing low energy electrons. The arrangement also includes a guide tube 333 through which the ion beam 331 passes, and which is connected to a voltage source (not shown) for applying a negative potential to the guide tube 333 to confine the low energy electrons injected into the beam plasma. See also U.S. patent application Ser. No. 07/984,670, filed Dec. 12, 1992 by Ito et al. The beam neutralising system is connected to a central processor/controller 335 for controlling the beam neutraliser. The central processor 335 receives signals from the channeltron 327 indicative of the measured slow ion energy, processes the signal or signals, and generates a control signal for controlling the beam neutralising system. The central processor 335 may also be arranged to control the ion beam generator 337, as described in relation to FIGS. 2 and 3. The central processor may be arranged to control the sensor to repeatedly scan the slow ion energy to measure the energy spectrum. The central processor may also be arranged to control the sensor to continuously monitor the energy of peak intensity.

Figure 10:
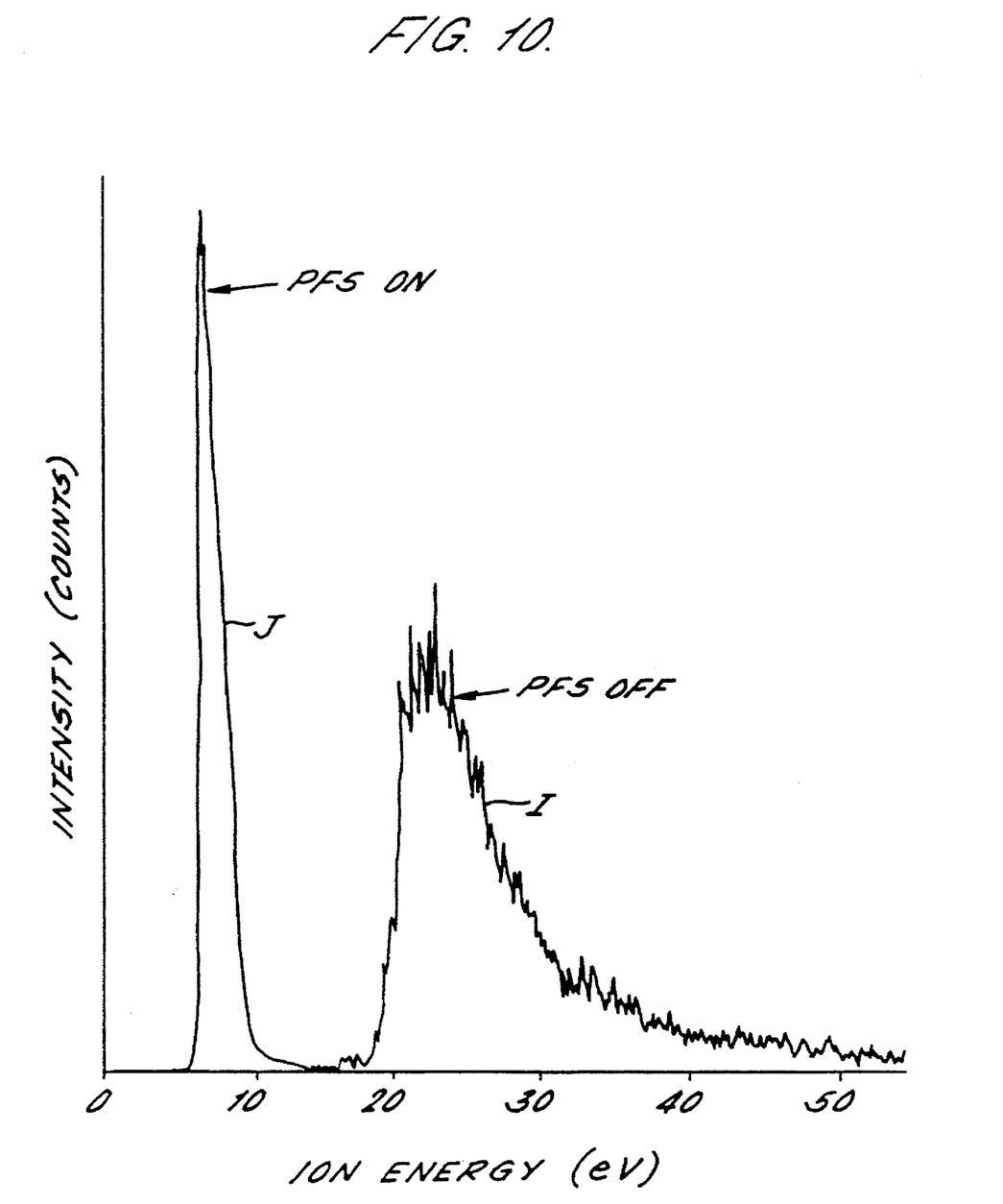
FIG. 10 shows a graph of the variation of slow ion current intensity with slow ion energy as measured by the sensor shown in FIGS. 7 to 9 with the ion beam neutralising system in both the on-and off-states.

FIG. 10 shows the variation of slow ion current with energy as measured by the sensor shown in FIG. 7. Curve I shows the slow ion energy spectrum without injection of electrons from the beam neutraliser into the ion beam and curve J shows the slow ion energy spectrum with injection of low energy electrons into the ion beam. Curve J has a relatively sharp peak as compared with curve I, the peak occurring at a much lower energy than curve I, demonstrating a marked reduction in ion beam potential with electron injection. The shape and structure of the two curves indicate that the sensor is capable of yielding much information about the processes occurring within the ion beam.

Figure 11:
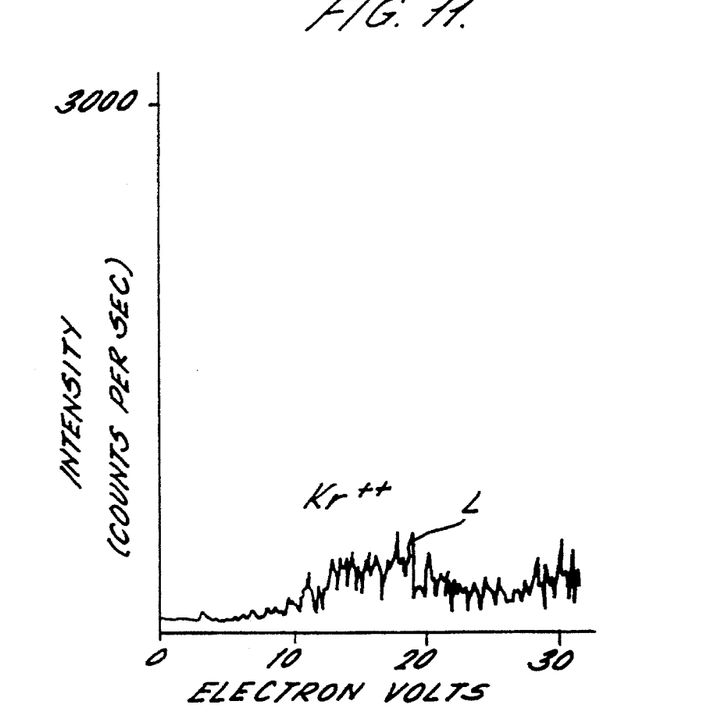
FIGS. 11 and 12 show graphs of the variation in the number of singly and doubly charged Krypton ions ejected from the ion beam with ion energy, as measured by the sensor shown in FIGS. 7 to 9.
Figure 12:
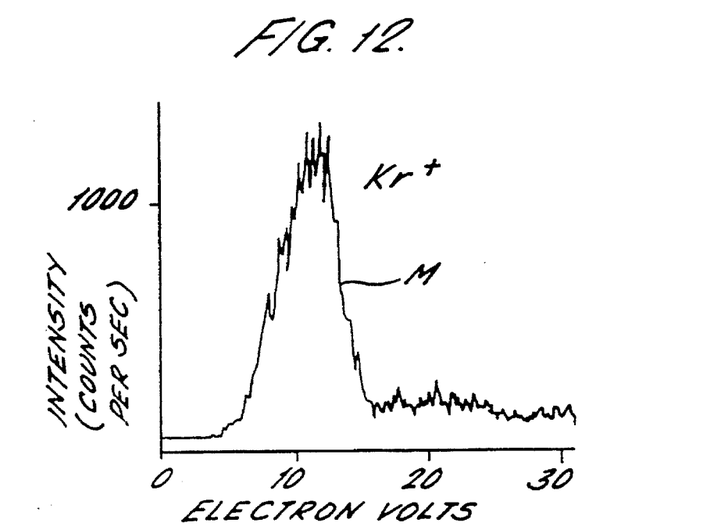

FIG. 11 shows the energy spectrum, as measured by the sensor shown in FIG. 7, of both singly and doubly charged Krypton ions transmitted through the sensor and selected by the quadrupole mass spectrometer. Curve M shows the energy spectrum for singly charged Krypton ions and curve L shows that for doubly charged Krypton ions. The results indicate that about ten times more singly charged Krypton ions are produced within the ion beam than doubly charged Krypton ions, and that therefore the predominant interaction between ions and neutrals within the ion beam is through ion exchange rather than inelastic collisions which produce both singly and doubly charged Krypton ions.

The mass spectrometer also allows the energy spectrum of other ions such as ionised water molecules nitrogen and oxygen to be obtained which provides more information regarding the processes occurring within the ion beam. For example, the presence of water molecules also indicates the presence of charge exchange interactions.

Although the embodiment of the sensor shown in FIG. 7 has two energy selectors which each bend the selected ions through 180°, a single energy selector may be used which bends the selected ions or charged particles through an angle less than or greater than 180°. The sensor may be adapted to measure the energy spectra of electrons ejected from the ion beam in addition to or as an alternative to slow ion spectra. In this case it is advantageous to coat the inner walls of the energy selector(s) with a suitable electron absorbing material, e.g. graphite or a graphite compound. Although the preferred ion collector is a channeltron, any other suitable means of collecting ions passed through the energy selectors may be used. Further, modifications to the embodiments hereinbefore described will be apparent to those skilled in the art.

We claim:

1. An ion implanter for implanting ions into a semiconductor substrate comprising an ion beam generator for generating an ion beam and a spectrum analyzer arranged to measure the energy of the greatest number of charged particles ejected from the ion beam by performing an band-pass energy scan.

2. An ion implanter as claimed in claim 1, wherein said spectrum analyzer comprises a cylindrical mirror analyzer having an aperture to receive charged particles, a deflector for deflecting those of the receiving charged particles within a predetermined energy band along a predetermined path and a detector arranged to detect only the deflected charged particles having energies within said predetermined energy band.

3. An ion implanter as claimed in claim 2, wherein said cylindrical mirror analyzer defines a further aperture to allow said charged particles deflected along said predetermined path to pass therethrough, and located between said deflector and said detector.

4. An ion implanter as claimed in claim 3, wherein said cylindrical mirror analyzer has a longitudinal axis between said aperture and said further aperture, and defines another aperture arranged to accept for transmission along said predetermined path only those of said received charged particles having a non-zero angle of entry into said analyzer relative to said axis, and wherein said deflector is arranged to deflect charged particles transmitted into the deflection region in a direction toward said axis.

5. An ion implanter as claimed in claim 2, wherein said deflector comprises an outer cylindrical electrode and a second inner electrode arranged within said outer cylindrical electrode, said electrodes defining an annular passage therebetween for transmission of said receiving charged particles, and a voltage source arranged to apply an electric field between the electrodes.

6. An ion implanter as claimed in claim 3, wherein at least one of said aperture and said further aperture is formed as an annular slit coaxial with and adjacent to the longitudinal axis of said analyzer.

7. An ion implanter as claimed in claim 2, further including an electrode arranged to prevent particles oppositely charged to those to be detected from reaching the detector.

8. An ion implanter as claimed in claim 1, further comprising a mass selector to select particles of a particular mass prior to detection by said spectrum analyzer.

9. An ion implanter as claimed in claim 8, wherein said mass selector comprises a quadrupole mass spectrometer.

10. An ion implanter as claimed in claim 1, wherein said spectrum analyzer comprises a hemispherical energy analyzer having first and second electrodes formed to define a curved passage therebetween and a voltage source arranged to apply an electric field between said electrodes sufficient to allow receiving charged particles within said energy band to be transmitted through said curved passage along a predetermined path.

11. An ion implanter as claimed in claim 10, wherein said hemispherical energy analyzer further comprises an energy scanner to change the energies of said receiving charged particles by a predetermined energy before said particles enter said curved passage, to enable charged particles of different energies to be transmitted through said passage for a fixed said electric field.

12. An ion implanter as claimed in claim 11, wherein said energy scanner comprises a cascade of at least three mutually insulated coaxially arranged, cylindrical electrodes defining a passage for said received charged particles and a voltage source arranged to apply a predetermined electric field between said electrodes.

13. An ion implanter as claimed in claim 1, further comprising a control signal generator to form a control signal related to the energy measured by said spectrum analyzer, and a controller responsive to said control signal to control a parameter in said ion beam.

14. An ion implanter as claimed in claim 13, wherein said controller is arranged to control a parameter in said ion beam generator in response to said control signal to reduce the potential of said ion beam.

15. An ion implanter as claimed in claim 14, wherein said ion beam generator comprises an ion source and an extraction electrode spaced therefrom for extracting ions from said ion source, wherein the parameter in said ion beam generator is the spacing between said extraction electrode and the ion source.

16. An ion implanter as claimed in claim 14, wherein said ion beam generator comprises an ion source and an extraction electrode spaced therefrom for extracting ions from said ion source, wherein the parameter in said ion beam generator is the electric field between said ion source and said extraction electrode.

17. An ion implanter as claimed in claim 14, further comprising an electron generator to generate electrons and an electron injector to inject said electrons into said ion beam, wherein said controller is adapted to control the injection of said electrons in response to said control signal to neutralize said beam.

18. A method of measuring the potential of an ion beam in an ion implanter, comprising measuring the energy of the greatest number of particles ejected from the ion beam by performing a band pass energy scan.

19. A method as claimed in claim 18, comprising using a cylindrical mirror analyzer to measure said energy.

20. A method as claimed in claim 18, comprising using a hemispherical energy analyzer to measure said energy.

21. A method of controlling the ion beam potential in an ion implanter, comprising measuring the ion beam potential by measuring the energy of the greatest number of particles ejected from the ion beam by performing a band pass energy scan, and controlling the ion beam potential in accordance with the measured energy.

* * * * *